United States Patent
Seon et al.

(10) Patent No.: US 9,053,979 B2
(45) Date of Patent: Jun. 9, 2015

(54) OXIDE THIN FILM, METHODS OF MANUFACTURING OXIDE THIN FILM AND ELECTRONIC DEVICES INCLUDING OXIDE THIN FILM

(71) Applicant: Samsung Electronics Co., Ltd., Suwon-Si, Gyeonggi-Do (KR)

(72) Inventors: Jong-Baek Seon, Yongin-si (KR); Myung-kwan Ryu, Yongin-si (KR); Kyung-Bae Park, Seoul (KR); Sang-yoon Lee, Seoul (KR); Bon-Won Koo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 123 days.

(21) Appl. No.: 13/779,355

(22) Filed: Feb. 27, 2013

(65) Prior Publication Data

US 2013/0248851 A1    Sep. 26, 2013

Related U.S. Application Data

(62) Division of application No. 13/064,466, filed on Mar. 28, 2011, now Pat. No. 8,394,668.

(30) Foreign Application Priority Data

Mar. 26, 2010    (KR) .................. 10-2010-0027347

(51) Int. Cl.
*H01L 29/10* (2006.01)
*H01L 29/12* (2006.01)
*H01L 31/18* (2006.01)

(52) U.S. Cl.
CPC ......... *H01L 29/12* (2013.01); *Y10T 428/24975* (2015.01); *H01L 31/1884* (2013.01); *Y02E 10/50* (2013.01)

(58) Field of Classification Search
CPC ... H01L 2227/32; H01L 33/405; H01L 33/42; H01L 51/5271; H01L 31/1884; H01L 29/12; Y02E 10/50
USPC ............ 257/43, 40, 98, 414; 438/99, 104, 85, 438/722, 756, 787; 430/311, 330; 136/252, 136/255

See application file for complete search history.

(56) References Cited

U.S. PATENT DOCUMENTS 5,545,432 A * 8/1996 DeGuire et al. ............... 427/226
5,699,035 A * 12/1997 Ito et al. .......................... 338/21
(Continued)

FOREIGN PATENT DOCUMENTS

| KR | 2000-0046477 A | 7/2000 |
| KR | 2003-0007024 A | 1/2003 |
| KR | 2007-0110350 A | 11/2007 |

OTHER PUBLICATIONS

European Search Report for 11159877.7-1555 dated Apr. 3, 2013.
(Continued)

*Primary Examiner* — Mohammed Shamsuzzaman
(74) *Attorney, Agent, or Firm* — Harness, Dickey & Pierce, P.L.C.

(57) ABSTRACT

Oxide thin film, electronic devices including the oxide thin film and methods of manufacturing the oxide thin film, the methods including (A) applying an oxide precursor solution comprising at least one of zinc (Zn), indium (In) and tin (Sn) on a substrate, (B) heat-treating the oxide precursor solution to form an oxide layer, and (C) repeating the steps (A) and (B) to form a plurality of the oxide layers.

13 Claims, 8 Drawing Sheets

(56) References Cited

U.S. PATENT DOCUMENTS

| | | | |
|---|---|---|---|
| 5,942,376 A * | 8/1999 | Uchida et al. | 430/330 |
| 5,980,977 A | 11/1999 | Deng et al. | |
| 6,543,107 B1 | 4/2003 | Miyashita et al. | |
| 6,653,701 B1 | 11/2003 | Yamazaki et al. | |
| 6,723,388 B2 | 4/2004 | Svendsen et al. | |
| 6,881,444 B2 | 4/2005 | Hong et al. | |
| 7,544,625 B2 | 6/2009 | Joshi et al. | |
| 7,604,839 B2 | 10/2009 | McCleskey et al. | |
| 7,695,998 B2 * | 4/2010 | Punsalan et al. | 438/99 |
| 2003/0026898 A1 | 2/2003 | Hong et al. | |
| 2004/0072672 A1 | 4/2004 | Harmer et al. | |
| 2005/0043184 A1 | 2/2005 | McCleskey et al. | |
| 2005/0172997 A1 | 8/2005 | Meier et al. | |
| 2006/0211267 A1 | 9/2006 | Joshi et al. | |
| 2007/0003877 A1 * | 1/2007 | Punsalan et al. | 430/311 |
| 2007/0134532 A1 | 6/2007 | Jacobson et al. | |
| 2007/0184576 A1 | 8/2007 | Chang et al. | |
| 2007/0238311 A1 | 10/2007 | Levy | |
| 2008/0107799 A1 | 5/2008 | Lu et al. | |
| 2008/0115821 A1 | 5/2008 | Xu et al. | |
| 2008/0182128 A1 | 7/2008 | Boy et al. | |
| 2008/0185037 A1 * | 8/2008 | Kim et al. | 136/252 |
| 2008/0193717 A1 | 8/2008 | Jongerden et al. | |
| 2008/0220153 A1 | 9/2008 | Mukherjee et al. | |
| 2008/0280103 A1 | 11/2008 | Uetsuka et al. | |
| 2008/0308151 A1 | 12/2008 | Den Boer et al. | |
| 2009/0085454 A1 | 4/2009 | Li et al. | |
| 2009/0104379 A1 * | 4/2009 | Umeno et al. | 428/1.51 |
| 2009/0194155 A1 | 8/2009 | Den Boer et al. | |
| 2009/0293936 A1 | 12/2009 | Myong | |
| 2010/0002357 A1 | 1/2010 | Kim et al. | |
| 2010/0184253 A1 | 7/2010 | Hirai et al. | |
| 2010/0319751 A1 | 12/2010 | Day et al. | |
| 2011/0139228 A1 * | 6/2011 | Arai et al. | 136/255 |
| 2011/0253997 A1 | 10/2011 | Park et al. | |
| 2011/0284061 A1 | 11/2011 | Vanecek et al. | |
| 2012/0070935 A1 | 3/2012 | Myong | |

OTHER PUBLICATIONS

European Office Action dated May 28, 2014 for corresponding application No. 11159877.7.

* cited by examiner

US 9,053,979 B2

OXIDE THIN FILM, METHODS OF MANUFACTURING OXIDE THIN FILM AND ELECTRONIC DEVICES INCLUDING OXIDE THIN FILM

CROSS-REFERENCE TO RELATED APPLICATION

This application is a divisional application of U.S. application Ser. No. 13/064,466, filed Mar. 28, 2011, which claims priority under 35 U.S.C. §119 to Korean Patent Application No. 10-2010-0027347 filed in the Korean Intellectual Property Office (KIPO) on Mar. 26, 2010. The entire contents of each of the above-mentioned applications is incorporated herein by reference.

BACKGROUND

1. Field

Example embodiments relate to an oxide thin film, methods of manufacturing the oxide thin film and electronic devices including the oxide thin film.

2. Description of the Related Art

Electronic devices such as resistors, capacitors, diodes and thin film transistors are used in various fields. Thin film transistors (TFT) may be used as switching and driving devices in a flat panel display such as a liquid crystal display (LCD), an organic light emitting diode display (OLED display) or an electrophoretic display (EPD).

Electronic devices such as thin film transistors may include a semiconductor thin film deposited using semiconductor processing (e.g., chemical vapor deposition (CVD)). According to the deposition method, the manufacturing cost of semiconductor devices may be high and the manufacturing processes thereof complicated.

In order to simplify semiconductor thin film deposition processes, a semiconductor thin film may be formed by a solution process using a precursor solution. However, a semiconductor thin film formed by a solution process results in a semiconductor device with poor or deteriorated semiconductor characteristics and reduced reliability as compared to a semiconductor thin film formed by other deposition methods.

SUMMARY

Example embodiments may provide an oxide thin film with improved reliability, methods of manufacturing the oxide thin film using simple and reduced complexity processes and electronic devices including the oxide thin film.

Methods of manufacturing oxide thin film according to example embodiments include (A) applying an oxide precursor solution comprising at least one of zinc (Zn), indium (In) and tin (Sn) on a substrate, (B) heat-treating the oxide precursor solution to form an oxide layer, and (C) repeating the steps (A) and (B) to form a plurality of the oxide layers. The thickness of the oxide layer may be about 10 Å to about 500 Å. The thickness of the oxide layer may be about 10 Å to about 400 Å. The thickness of the oxide layer may be a thickness of about 10 Å to about 200 Å. The thickness of the oxide layer may be about 10 Å to about 100 Å. The step (C) may be performed 2 to 20 times. The heat treatment of the oxide precursor solution may include primary heat treatment and secondary heat treatment at higher temperature than the primary heat treatment. The secondary heat treatment may be conducted at about 300° C. or higher temperature.

The oxide precursor solution may include zinc (Zn) and indium (In). The atomic ratio of zinc (Zn) and indium (In) in the oxide precursor solution may be about 1:10 to about 10:1. The atomic ratio of zinc (Zn) and indium (In) in the oxide precursor solution may be about 1:5 to about 5:1.

The oxide precursor solution may further include at least one metal selected from the group consisting of hafnium (Hf), magnesium (Mg), tantalum (Ta), cerium (Ce), lanthanum (La), gallium (Ga), zirconium (Zr), silicon (Si), germanium (Ge), vanadium (V), niobium (Nb), and yttrium (Y). The amount of the metal in the oxide precursor solution may be less than or equal to about 50 at % based on the total atomic number of the zinc and the indium. The steps (A) and (B) may be performed by a sol-gel process. The interface region between the oxide layers may have a higher density than the internal region of each of the oxide layers. The oxide thin film may be amorphous. The oxide thin film may be nanocrystalline. The oxide thin film may be amorphous and nanocrystalline. The oxide thin film may be a semiconductor.

An oxide thin film according to other example embodiments includes a plurality of oxide layers, each of the oxide layers including at least one of zinc (Zn), indium (In) and tin (Sn). The thickness of the oxide layer may be about 10 Å to about 500 Å. The thickness of the oxide layer may be about 10 Å to about 400 Å. The thickness of the oxide layer may be about 10 Å to about 200 Å. The thickness of the oxide layer may be about 10 Å to about 100 Å. The refractive index of the oxide thin film including a plurality of oxide layers may be greater than the refractive index of a single oxide layer with the same thickness as the oxide thin film.

Each of the oxide layers may include zinc (Zn) and indium (In). The atomic ratio of the zinc (Zn) and the indium (In) in the oxide layer may be about 1:10 to about 10:1. The atomic ratio of the zinc (Zn) and the indium (In) in the oxide layer may be about 1:5 to about 5:1. The each of the oxide layers may further include at least one metal selected from the group consisting of hafnium (Hf), magnesium (Mg), tantalum (Ta), cerium (Ce), lanthanum (La), gallium (Ga), zirconium (Zr), silicon (Si), germanium (Ge), vanadium (V), niobium (Nb), and yttrium (Y). The interface region between the oxide layers may have a higher density than the internal region of each of the oxide layers. The oxide thin film may be amorphous. The oxide film may be nanocrystalline. The oxide film may be amorphous and nanocrystalline. Electronic device according to still other example embodiments may include the oxide thin film. The oxide thin film may be used as semiconductor.

BRIEF DESCRIPTION OF THE DRAWINGS

Example embodiments will be more clearly understood from the following brief description taken in conjunction with the accompanying drawings.

FIGS. 1-5 are cross-sectional diagrams illustrating methods of manufacturing oxide thin film according to example embodiments;

FIG. 6 is a transmission electron microscope (TEM) photograph of an oxide thin film including three oxide layers according to example embodiments;

FIG. 7 is a TEM photograph that is a magnification of "A" of FIG. 6;

FIG. 8 is a graph of refractive index (RI) as a function of thickness (A) for IZO thin films according to two examples;

FIG. 9 is a graph of drain-to-source current ($I_{DS}$ (A)) as a function of gate voltage ($V_G$ (V)) of thin film transistors manufactured according to an example embodiment and a comparative example; and FIG. 10 is a graph of refractive index (RI) as a function of thickness (Å) for oxide thin films manufactured according to example embodiments.

Figure 1:
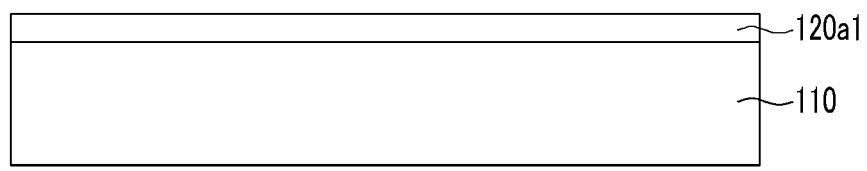
FIGS. 1-10 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1-5 are cross-sectional diagrams illustrating methods of manufacturing oxide thin films according to example embodiments. Referring to FIG. 1, an oxide precursor solution including at least one of zinc (Zn), indium (In) and tin (Sn) may be prepared. The oxide precursor solution may be applied on a substrate 110 by, for example, spin coating, slit coating or Inkjet printing. The applied oxide precursor may be dried to form an oxide precursor layer 120a1 by, for example, a sol-gel process.

Figure 2:
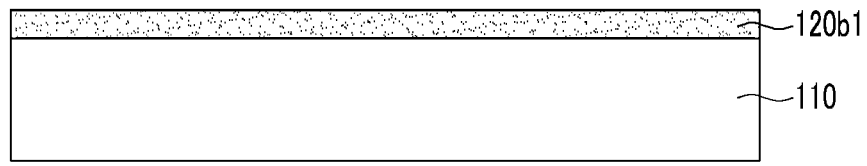

Referring to FIG. 2, the oxide precursor layer 120a1 may be transformed into an oxide layer 120b1. For example when the oxide precursor layer 120a1 is heat-treated, the oxide precursor layer 120a1 may be oxidized to form the oxide layer 120b1. According to example embodiments, one or more heat treatments may be performed. For example, the heat treatment may be performed twice, and may include the primary heat treatment and the secondary heat treatment. The secondary heat treatment may be performed at higher temperature than the primary heat treatment. The secondary heat treatment may be performed at about 300° C. or higher temperature. For example, the primary heat treatment may be performed at about 100° C. to about 300° C. and the secondary heat treatment may be performed at about 300° C. to about 1000° C.

The oxide layer 120b1 may be thin. For example, according to example embodiments the oxide layer 120b1 may be formed to the thickness of about 10 Å to about 500 Å. According to other example embodiments, the thickness of the oxide layer 120b1 may be about 10 Å to about 400 Å. According to still other example embodiments, the thickness of the oxide layer 120b1 may be about 10 Å to about 200 Å. According to still other example embodiments, the thickness of the oxide layer 120b1 may be about 10 Å to about 100 Å.

Figure 3:
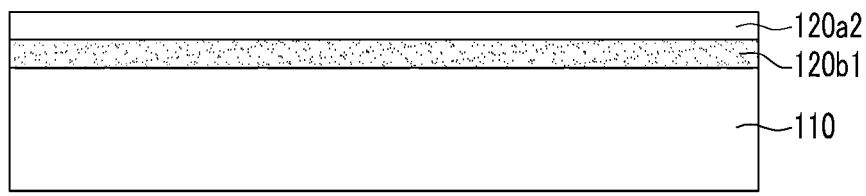
Figure 4:
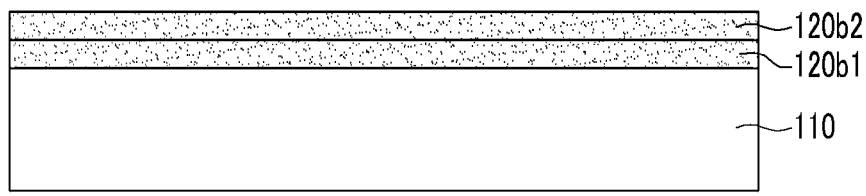

Referring to FIG. 3, an oxide precursor solution may be reapplied on the oxide layer 120b1 to form an oxide precursor layer 120a2. For example, the oxide precursor solution described with respect to FIGS. 1 and 2 may be reapplied using a sol-gel process to form the oxide precursor layer 120a2. Referring to FIG. 4, the oxide precursor layer 120a2 may be transformed into an oxide layer 120b2. When the oxide precursor layer 120a2 is heat-treated, the oxide precursor layer 120a2 may be oxidized to form the oxide layer 120b2. The oxide layer 120b2 may be thin. For example, according to example embodiments, the oxide layer 120b2 may be formed to the thickness of about 10 Å to about 500 Å. According to other example embodiments the thickness of the oxide layer 120b2 may be formed to a thickness of about 10 Å to about 400 Å. According to still other example embodiments the oxide layer 120b2 may be formed to a thickness of about 10 Å to about 200 Å. According to still other example embodiments the oxide layer 120b2 may be formed to a thickness of about 10 Å to about 100 Å.

Figure 5:
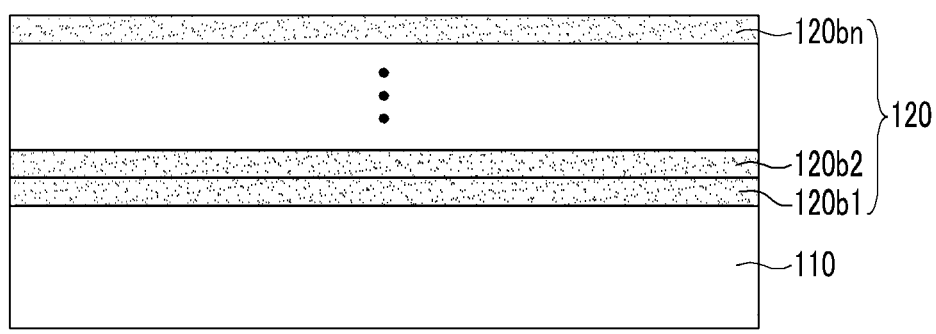

Referring to FIG. 5, the application of the oxide precursor solution and the heat treatment of the oxide precursor layer may be repeatedly performed to form an oxide thin film 120 including a plurality of oxide layers 120b1-120bn, wherein n is a natural number (e.g., 1, 2, 3 . . . n).

For example, application of the oxide precursor solution and heat treatment of an oxide precursor layer may be performed 2 to 20 times.

Each oxide layer 120b1-120bn may include an internal region with a plurality of pores and at least one interface region between the oxide layers 120b1-120bn having higher density than the internal region. The plurality of pores may be produced during the formation by sol-gel process. The density may be confirmed by, for example, the refractive index and a transmission electron microscope (TEM) photograph of the oxide thin film.

According to example embodiments, each oxide layer 120b1-120bn may be formed sufficiently thin to decrease the internal region with pores and increase the interface regions between the oxide layers with high density. Overall density of the oxide thin film 120 may be increased and pores produced during a sol-gel process may be reduced to prevent deterioration of mechanical-electrical characteristics of the oxide thin film 120 due to the pores. Reliability of electronic devices using an oxide thin film 120 as a semiconductor may be improved.

An oxide thin film 120 may be used for various electronic devices, for example, a thin film transistor, an optical waveguide and/or a solar cell. An oxide thin film 120 in a thin film transistor may be used as, for example, an oxide semiconductor. An oxide thin film 120 in a solar cell may be used as, for example, an active layer. Example embodiments are applicable to any electronic device including an oxide thin film (e.g., an oxide semiconductor).

An oxide precursor solution including at least one of zinc (Zn), indium (In) and tin (Sn) may disturb crystallization during heat treatment to form an amorphous and/or nanocrystalline oxide thin film. Herein, the term "amorphous" means a material which does not exhibit any particular pattern in atomic order and the term "nanocrystalline" means a particle or grain having at least one dimension less than about 100 nm.

The oxide precursor solution may include, for example, at least one of a zinc (Zn) containing precursor, an indium (In) containing precursor and tin (Sn) containing precursor. When the oxide precursor solution includes the zinc (Zn) containing precursor and the indium (In) containing precursor, the atomic ratio of the zinc to the indium in the oxide precursor solution may be about 1:10 to about 10:1, particularly about 1:5 to about 5:1. Within the above range, semiconductor characteristics may exist in an oxide layer.

The zinc containing precursor may be at least one of a zinc salt and a hydrate thereof, but is not limited thereto. The zinc containing precursor may include, for example, zinc hydroxide, a zinc alkoxide, a zinc citrate, a zinc acetate (e.g., zinc trifluoroacetate), a zinc (meth)acrylate, zinc nitrate, a zinc acetylacetonate (e.g., zinc hexafluoroacetylacetonate, zinc chloride, zinc fluoride, and/or zinc perchlorate), a zinc dialkyldithiocarbamate (e.g., zinc dimethyldithiocarbamate and/or zinc diethyldithiocarbamate), a zinc sulfonate (e.g., zinc trifluoromethanesulfonate), a zinc undecylenate, a zinc borate (e.g., zinc tetrafluoroborate), and a hydrate thereof.

The indium containing precursor may be at least one of an indium salt and a hydrate thereof, but is not limited thereto. The indium containing precursor may include indium hydroxide, an indium alkoxide (e.g., indium isopropoxide), indium acetyl acetonate, indium acetate, an indium halide (e.g., indium chloride and/or indium fluoride), indium nitrate and a hydrate thereof.

The tin containing precursor may be at least one of a tin salt and a hydrate thereof, but is not limited thereto. The tin containing precursor may include tin hydroxide, a tin alkoxide, tin acetyl acetonate, tin acetate, a tin halide, tin nitrate and a hydrate thereof.

The oxide precursor solution may further include at least metal selected from the group consisting of hafnium (Hf), magnesium (Mg), tantalum (Ta), cerium (Ce), lanthanum (La), gallium (Ga), zirconium (Zr), silicon (Si), germanium (Ge), vanadium (V), niobium (Nb), and yttrium (Y). A metal containing precursor may be introduced, for example, as a halide (e.g., hafnium chloride ($HfCl_4$)), an acetate compound, a carbonyl compound, a carbonate compound, a nitride compound, and/or an alkoxide compound.

The metal may be included in an amount of about 50 at % or less, based on the total atomic number of at least one of zinc, indium and tin in the oxide precursor solution. The metal may function for controlling a threshold voltage of the oxide thin film. At least one of the zinc containing precursor, the indium containing precursor and the tin containing precursor, and the metal containing precursor may be included respectively in the amount of about 0.01 to 30 wt %, based on the total amount of the oxide precursor solution.

The oxide precursor solution may further include a solution stabilizer. The solution stabilizer may include, for example, at least one of an amine compound, an alcohol amine compound (e.g., monoethanolamine, diethanolamine, triethanolamine, N,N-methylethanolamine, aminoethyl ethanolamine, N-t-butylethanolamine, N,t-butyldiethanolamine, and/or diethylene glycol amine), an alkyl ammonium hydroxide (e.g., tetramethylammonium hydroxide, methylamine, ethylamine, and/or monoisopropylamine), a ketone compound (e.g., acetylacetone, ammonium hydroxide, potassium hydroxide, and/or sodium hydroxide), an alkoxyalcohol (e.g., 2-(aminoethoxy)ethanol) and/or deionized water.

The solution stabilizer may be included in the oxide precursor solution to increase solubility of the zinc containing precursor, the indium containing precursor, the tin containing precursor and the metal containing precursor so as to form a uniform oxide layer. The solution stabilizer may be included in an amount of about 0.01 to 30 wt % of the total amount of the oxide precursor solution.

According to example embodiments, a zinc containing precursor, an indium containing precursor, a tin containing precursor, a metal containing precursor and a solution stabilizer may be mixed in a solvent to be prepared an oxide precursor solution. Alternatively, the zinc containing precursor, the indium containing precursor, the tin containing precursor and the metal containing precursor may be independently prepared and then mixed.

The solution stabilizer may be added to the zinc containing precursor, the indium containing precursor, the tin containing precursor and the metal containing precursor, respectively. Alternatively, the solution stabilizer may be added after mixing the zinc containing precursor, the indium containing precursor, the tin containing precursor and the metal containing precursor. For example, zinc acetate hydrate and indium acetyl acetonate may be mixed in each solvent to independently prepare a zinc acetate hydrate solution and an indium acetyl acetonate solution, the zinc acetate hydrate solution and the indium acetyl acetonate solution may be mixed, and hafnium chloride and/or a hafnium-chloride-containing solution may be added thereto to prepare a precursor solution. According to example embodiments, the zinc containing precursor, the indium containing precursor, the tin containing precursor, the metal containing precursor and the solution stabilizer may be mixed in a solvent together to prepare an oxide precursor solution.

The solvent may be any solvent that dissolves the zinc containing precursor, the indium containing precursor, the tin containing precursor, the metal containing precursor and the solution stabilizer. Non-limiting examples of the solvent may include at least one of deionized water, methanol, ethanol, propanol, isopropanol, 2-methoxyethanol, 2-ethoxyethanol, 2-propoxyethanol 2-butoxyethanol, methyl cellosolve, ethyl cellosolve, diethyleneglycol methylether, diethyleneglycolethylether, dipropyleneglycol methylether, toluene, xylene, hexane, heptane, octane, ethylacetate, butylacetate, diethyleneglycol dimethylether, diethyleneglycol dimethylethylether, methylmethoxy propionate, ethylethoxy propionate, ethyl lactate, propyleneglycol methylether acetate, propyleneglycol methylether, propyleneglycol propylether, methyl cellosolve acetate, ethyl cellosolve acetate, diethyleneglycol methyl acetate, diethyleneglycolethyl acetate, acetone, methylisobutylketone, cyclohexanone, dimethyl formamide (DMF), N,N-dimethyl acetamide (DMAc), N-methyl-2-pyrrolidone, γ-butyroctone, diethylether, ethyleneglycol dimethylether, diglyme, tetrahydrofuran, acetylacetone, and/or acetonitrile.

The following examples illustrate example embodiments in more detail. However, it is understood that the scope of example embodiments are not limited to these examples.

Example 1

Preparation of Oxide Precursor Solution

Indium acetylacetonate (InAcac) was mixed in 2-methoxyethanol at concentration of about 0.05M, and ethanolamine was added thereto in an amount of about 3 equivalents with regard to InAcac to prepare the indium acetylacetonate solution. Zinc acetate anhydrate was mixed in 2-methoxyethanol at concentration of about 0.05M, and ethanolamine was added thereto in an amount of about 1 equivalent with regard to Zinc acetate anhydrate to prepare the zinc acetate anhydride solution. The indium acetylacetonate solution and the zinc acetate anhydride solution were mixed at the ratio of about 3:1 to prepare an oxide precursor solution.

Formation of an Oxide Thin Film

The oxide precursor solution was spin-coated onto a silicon wafer. The spin coating was performed at about 500 rpm for about 30 seconds. A primary heat treatment was performed at about 250° C. and a secondary heat treatment was performed at about 450° C. for about 1 hour to form an IZO layer with thickness of about 120 Å. Processes of coating an oxide precursor solution on an IZO layer and heat treating the oxide precursor solution were sequentially performed twice to form an oxide thin film including 3 IZO layers.

Example 2

Indium nitrate ($In(NO_3)_3$) and zinc acetate dihydrate were mixed at a mole ratio of about 3:1 in 2-methoxyethanol at concentration of about 0.1M, and ethanolamine and acetic acid were added to prepare an oxide precursor solution.

Formation of an Oxide Thin Film

The oxide precursor solution was spin coated onto a silicon wafer. The spin coating was performed at about 1500 rpm for about 30 seconds. The primary heat treatment was performed at about 300° C. and the secondary heat treatment was performed at about 450° C. for about 1 hour to form an IZO layer with thickness of about 120 Å. Processes of coating an oxide precursor solution on an IZO layer and heat treating the oxide precursor solution were sequentially performed twice to form an oxide thin film including 3 IZO layers.

Example 3

Indium nitrate hydrate, zinc acetate dihydrate and gallium nitrate hydrate were mixed at mole ratio of about 3:1:2 in 2-methoxyethanol at concentration of about 0.1 M, and ethanolamine and acetic acid were added to prepare an oxide precursor solution including gallium.

Formation of an Oxide Thin Film

The oxide precursor solution was spin coated onto a silicon wafer. The spin coating was conducted at about 3000 rpm for about 30 seconds. A primary heat treatment was performed at about 300° C. and a secondary heat treatment was performed at about 550° C. for about 1 hour to form a Ga-IZO layer. Processes of coating of an oxide precursor solution on a Ga-IZO layer and heat treating the oxide precursor solution were performed 4 times to form an oxide thin film including 5 Ga-IZO layers.

Manufacture of Thin Film Transistor

Molybdenum tungsten (MoW) was deposited on a glass substrate to a thickness of about 2000 Å, and was photolithographed to form a gate electrode. Silicon nitride was deposited to a thickness of about 2000 Å by a chemical vapor deposition (CVD) method to form a gate insulating layer. An oxide precursor solution was spin coated onto the gate insulating layer and a primary heat treatment was performed. The spin coating was performed at about 3000 rpm for about 30 seconds. The primary heat treatment was performed at about 300° C. for several minutes. A secondary heat treatment was performed at about 550° C. for about 1 hour in a furnace to form a Ga-IZO layer. Processes of coating an oxide precursor solution on the Ga-IZO layer and heat treating the oxide precursor solution were conducted 4 times to form an oxide thin film including 5 Ga-IZO layers. Tantalum was deposited to a thickness of about 1000 Å, and a source electrode and a drain electrode were formed using a shadow mask.

Example 4

Several silicon wafers were prepared. The oxide precursor solution prepared as in [Example 1] was coated onto each silicon wafer. The coating amount of the oxide precursor solution on each silicon wafer was varied. A primary heat treatment was performed at about 250° C. and a secondary heat treatment was performed at about 450° C. for about 1 hour to form IZO layers with various thicknesses.

Comparative Example 1

Indium nitrate hydrate, zinc acetate dihydride and gallium nitrate hydrate were mixed at a mole ratio of about 3:1:2 in 2-methoxyethanol at concentration of about 0.5M, and ethanolamine and acetic acid were added to prepare an oxide precursor solution including gallium.

Oxide Thin Film

The oxide precursor solution was spin coated onto a silicon wafer. The spin coating was performed at about 3000 rpm for about 30 seconds. A primary heat treatment was performed at about 300° C. and a secondary heat treatment was performed at about 550° C. for about 1 hour to form a single oxide layer of Ga-IZO with the same thickness as 5 Ga-IZO layers according to [Example 3]

Manufacture of Thin Film Transistor

A thin film transistor was manufactured by substantially the same method as described above with respect to [Example 3], except that the single oxide layer of Ga-IZO with a thickness of about 430 Å was formed as a semiconductor layer by spin coating, instead of the 5 Ga-IZO layers.

Evaluation

Thin Film Formation

Figure 6:
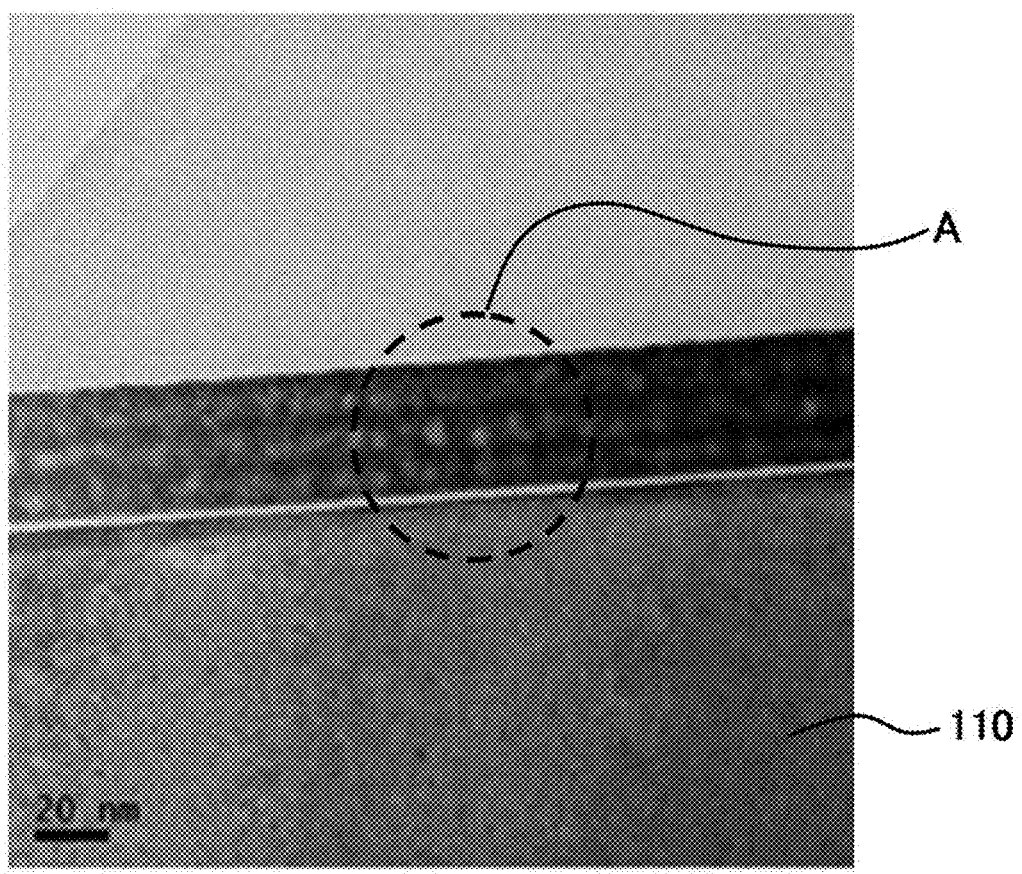
Figure 7:
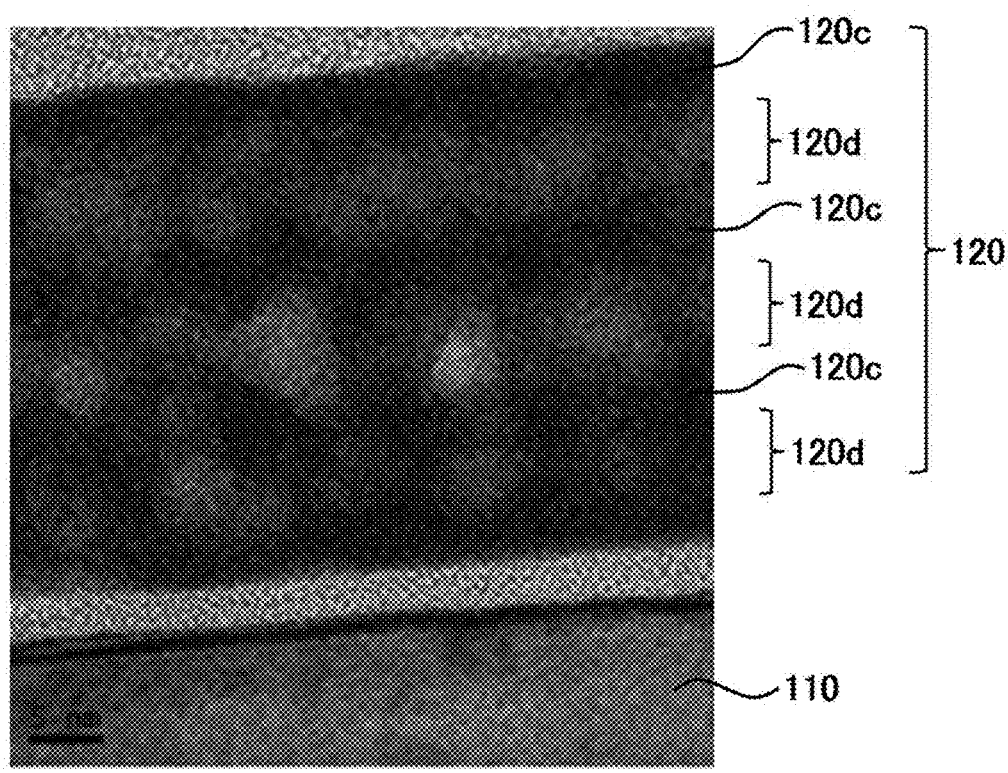

FIG. 6 is a transmission electron microscope (TEM) photograph of an oxide thin film including 3 sequentially deposited layers according to [Example 2]. FIG. 7 is a TEM photograph that is a magnification of "A" of FIG. 6. Referring to FIGS. 6 and 7, formation of an oxide thin film according to [Example 2] was confirmed. An oxide thin film 120 including 3 IZO layers was formed on the silicon wafer 110 according to the method described above with respect to [Example 2]. The interface regions 120c between the IZO layers were dark compared to the internal regions 120d of each IZO layer, which confirmed that the interface regions 120c between the IZO layers is of higher density than the internal regions 120d of the IZO layer.

Refractive Index-1

Figure 8:
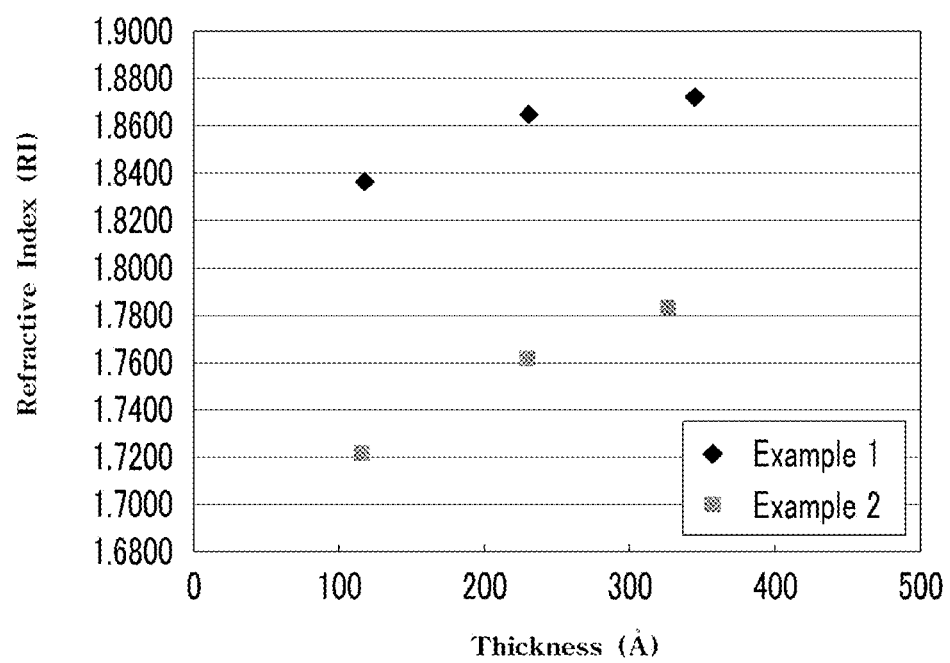

FIG. 8 is a graph of refractive index (RI) as a function of thickness (Å) for IZO thin films according to two examples. The refractive index was measured for oxide thin films with 1, 2, and 3 layers, the layers formed according to [Example 1] and [Example 2]. Referring to FIG. 8, oxide thin films according to [Example 1] including 1, 2 or 3 IZO layers with thickness of about 120 Å each were formed. The refractive index gradually increased as the number of layers increased. Oxide thin films according to [Example 2] including 1, 2 and 3 IZO layers with a thickness of about 120 Å each were formed. The refractive index gradually increased as the number of layers increased.

According to FIG. 8, as a plurality of thin IZO layers are formed, a ratio of the internal regions of the IZO layers to the total thickness of the oxide thin film decreased while the ratio of interface regions between the IZO layers to the total thickness of the oxide thin film increased, as compared to a single layer with the same thickness as a plurality of thin IZO layers, thereby increasing the total density of the oxide thin film.

Refractive Index-2

Refractive indices of oxide thin films manufactured according to [Example 3] and [Comparative Example 1] were compared in Table 1 (below).

TABLE 1

|  | [Example 3] | [Comparative Example 1] |
| --- | --- | --- |
| Refractive index | 1.81 | 1.76 |

As shown in Table 1, for oxide thin films with the same thickness, the refractive index of an oxide thin film including 5 thin layers according to [Example 3] was higher than the refractive index of a single oxide layer according to [Comparative Example 1].

Thin Film Transistor Characteristic

Figure 9:
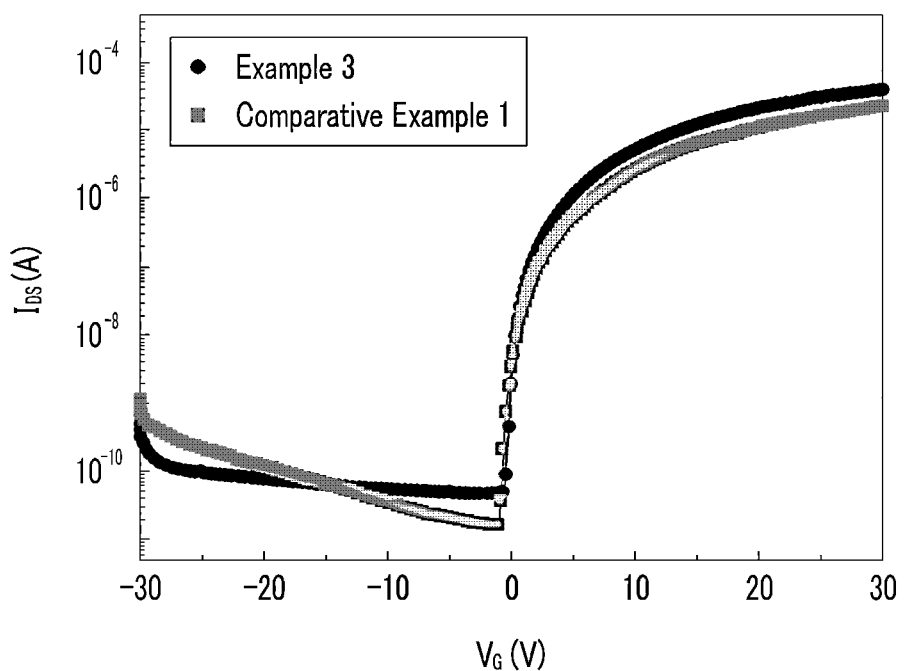

FIG. 9 is a graph of drain-to-source current (IDS (A)) as a function of gate voltage (VG (V)) of thin film transistors manufactured according to [Example 3] and [Comparative Example 1]. Table 2 (below) is a table of measured charge mobilities for thin film transistors prepared according to [Example 3] and [Comparative Example 1].

TABLE 2

|  | [Example 3] | [Comparative Example 1] |
| --- | --- | --- |
| Charge mobility (cm$^2$/Vs) | 1.32 | 0.85 |

Referring to FIG. 9 and Table 2, for oxide layers with the same thickness used as semiconductor layers in transistors, charge mobility of an oxide thin film including a plurality of oxide layers was greater than charge mobility of a single oxide layer with the same thickness as the oxide thin film. An oxide thin film according to example embodiments may be of higher density and improved film quality as compared to a single oxide layer.

Refractive Index-3

Figure 10:
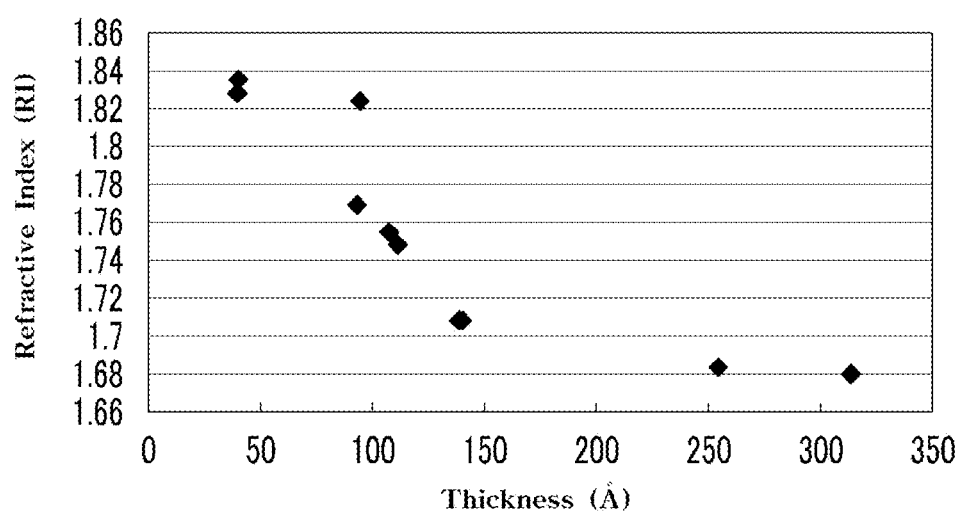

FIG. 10 is a graph of refractive index (RI) as a function of thickness (Å) for oxide thin film with various thicknesses prepared according to [Example 4]. Referring to FIG. 10, for the thickness of an oxide thin film of about 200 Å or less, the refractive index increased as thickness decreases.

While example embodiments have been particularly shown and described, it will be understood by one of ordinary skill in the art that variations in form and detail may be made therein without departing from the spirit and scope of the claims.

What is claimed is:

1. An oxide thin film, comprising:
a plurality of oxide layers, each of the oxide layers comprising at least one of zinc (Zn), indium (In) and tin (Sn),
wherein a thickness of each of the oxide layers is about 10 Å to about 200 Å,
wherein an interface region between the oxide layers has a higher density of oxide than pores density inside an internal region of each of the oxide layers, and
wherein a refractive index and a charge mobility of the oxide thin film including the plurality of oxide layers are greater than a refractive index and a charge mobility of a similarly-formed single-layer oxide structure having a thickness that is equal to a total thickness of the oxide thin film including the plurality of oxide layers.

2. The oxide thin film of claim 1, wherein the thickness of each of the oxide layers is about 10 Å to about 100 Å.

3. The method of claim 1, wherein each of the oxide layers comprises zinc (Zn) and indium (In).

4. The oxide thin film of claim 3, wherein an atomic ratio of zinc (Zn) to indium (In) in the oxide layer is about 1:10 to about 10:1.

5. The oxide thin film of claim 3, wherein an atomic ratio of zinc (Zn) to indium (In) in the oxide layer is about 1:5 to about 5:1.

6. The oxide thin film of claim 1, wherein each of the oxide layers further comprises at least one metal selected from the group consisting of hafnium (Hf), magnesium (Mg), tantalum (Ta), cerium (Ce), lanthanum (La), gallium (Ga), zirconium (Zr), silicon (Si), germanium (Ge), vanadium (V), niobium (Nb), and yttrium (Y).

7. The oxide thin film of claim 1, wherein the oxide thin film is amorphous.

8. The oxide thin film of claim 1, wherein the oxide thin film is nanocrystalline.

9. The oxide thin film of claim 1, wherein the oxide thin film is amorphous and nanocrystalline.

10. The oxide thin film of claim 1, wherein the oxide thin film is a semiconductor.

11. An electronic device comprising the oxide thin film of claim 1.

12. The electronic device of claim 11, wherein the oxide thin film is a semiconductor.

13. The electronic device of claim 11, wherein the oxide thin film is amorphous and nanocrystalline.

* * * * *